United States Patent
Rezzi et al.

(10) Patent No.: US 6,492,918 B1
(45) Date of Patent: Dec. 10, 2002

(54) CODE WORD HAVING DATA BITS AND CODE BITS AND METHOD FOR ENCODING DATA

(75) Inventors: Francesco Rezzi, San Jose, CA (US); Marcus Marrow, Dublin (IE)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/410,276

(22) Filed: Sep. 30, 1999

(51) Int. Cl.[7] .................................................. H03M 5/06
(52) U.S. Cl. ........................ 341/68; 341/59; 341/95; 341/67; 341/106; 341/81; 714/723; 714/799; 371/43.7; 371/49.1
(58) Field of Search ............................. 341/68, 59, 95, 341/106, 67

(56) References Cited

U.S. PATENT DOCUMENTS

| | | | | |
|---|---|---|---|---|
| 4,142,174 A | * | 2/1979 | Chen et al. .................. 714/784 |
| 5,430,744 A | | 7/1995 | Fettweis et al. ............... 371/43 |
| 5,460,976 A | * | 10/1995 | O'Connor .................... 436/510 |
| 5,614,901 A | * | 3/1997 | Haas ............................ 341/68 |
| 5,751,744 A | * | 5/1998 | Babb ........................... 714/746 |
| 5,774,078 A | * | 6/1998 | Tanaka et al. ................. 341/68 |
| 5,870,040 A | * | 2/1999 | Ando ........................... 341/106 |
| 5,896,405 A | * | 4/1999 | Moon ........................... 714/795 |
| 6,072,410 A | * | 6/2000 | Kim .............................. 341/59 |

* cited by examiner

*Primary Examiner*—Michael Tokar
*Assistant Examiner*—Lam T. Mai
(74) *Attorney, Agent, or Firm*—Lisa K. Jorgenson; Bryan A. Santarelli

(57) ABSTRACT

A code word includes a first group of data bits and includes code bits that represent a second group of data bits. One embodiment of the code word has a minimum probability of bit transitions among its bits. Another embodiment of the code word includes a parity bit. Unlike conventional codes, a code that includes such a code word can have both a high efficiency and small error propagation. Additionally, by including fewer bit transitions, a sequence of such code words causes less read noise, and thus causes fewer read errors as compared to sequences of known code words. Moreover, the code word can include a parity bit to allow improved error detection as compared to known error-detection techniques. Therefore, such a code word can significantly increase the effective write and read speeds of a disk drive.

54 Claims, 9 Drawing Sheets

CODE WORD HAVING DATA BITS AND CODE BITS AND METHOD FOR ENCODING DATA

CROSS-REFERENCE TO RELATED APPLICATIONS

This application is related to U.S. patent application Ser. No. 09/409,923 entitled PARITY-SENSITIVE VITERBI DETECTOR AND METHOD FOR RECOVERING INFORMATION FROM A READ SIGNAL, Ser. No. 09/410,274, and U.S. patent application entitled CIRCUIT AND METHOD FOR RECOVERING SYNCHRONIZATION INFORMATION FROM A SIGNAL, which have the same filing date as the present application and which are incorporated by reference.

TECHNICAL FIELD

The invention relates generally to signal encoding and more particularly to a technique for encoding data for storage on a magnetic medium such as a computer disk.

BACKGROUND OF THE INVENTION

The operating speeds of peripheral computer components such as disk drives often prevent computer engineers from designing faster computer systems. The speeds of microprocessors, which are at the hearts of today's computer systems, have increased dramatically within the last few years. But the speeds of today's disk drives and semiconductor memory circuits have lagged behind. Therefore, these slower peripheral components typically limit the overall speed of a computer system because the system microprocessor must effectively "slow down" to transfer data to and from these components. That is, these slower components are the "weak link in the chain". Fortunately, the new RAMBUS® architecture promises to make the next generation of semiconductor memory circuits as fast or faster than the next generation of microprocessors. But, there have been no speed-increasing breakthroughs of this magnitude in disk-drive technology.

Unfortunately, conventional data-encoding techniques can further reduce the already slow data-transfer rates of many disk drives. For example, many data codes are relatively inefficient, i.e., use a relatively large number of code bits per data bit, and thus may significantly reduce the effective writing speed of a disk drive. Furthermore, many data codes are poorly designed, and thus may significantly reduce the effective reading speed of a disk drive. Specifically, if the system processor initially detects a read error, then it tries to correct the error using conventional error-correction techniques. If the processor cannot correct the error using these techniques, then it instructs the disk drive to re-read the data. Unfortunately, error detection, error correction, and data re-read are time-consuming actions that can significantly reduce the effective reading speed of a disk drive.

FIG. 1 is a block diagram of a conventional disk-drive write channel 10, which includes an encoder 12 for encoding data into a Non-Return-To-Zero-Interleave (NRZI) sequence of conventional Run-Length-Limited (RLL) code words. The write channel 10 also includes a pre-coder 14 for converting this NRZI sequence of code words into a corresponding Non-Return-To-Zero (NRZ) sequence of code words. A write-head driver circuit 16 provides the NRZ sequence of code words to a write head 18, which writes the code words onto a magnetic storage medium 20 such as a hard disk.

Unfortunately, conventional RLL coding techniques often limit the speed at which the channel 10 can write data to the medium 20, and thus limit the data-write speed of the disk drive containing the channel 10 and the medium 20. As discussed below in conjunction with FIGS. 3 and 4, an RLL code word is often relatively inefficient, and this inefficiency limits the effective speed at which the channel 10 can write data to the medium 20. Therefore, it is difficult if not impossible to realize significant increases in data-write speeds using conventional RLL coding techniques.

FIG. 2 is a block diagram of a conventional read channel 22, which reads the NRZ sequence of RLL code words that the write channel 10 (FIG. 1) wrote to the storage medium 20. The read channel 22 includes a read head 24 for reading the code words stored on the medium 20 and for generating a corresponding read signal. A read circuit 26 amplifies the read signal, and a Viterbi detector 28 recovers the NRZ sequence of RLL code words from the read signal. A post-coder 30 converts the recovered NRZ sequence into the corresponding NRZI sequence, and a decoder 32 decodes the NRZI sequence into the read data. Assuming there are no read errors, the recovered NRZ sequence, NRZI sequence, and read data are respectively the same as the NRZ sequence generated by the pre-coder 14, the NRZI sequence generated by the encoder 12, and the write data provided to the encoder 12 (FIG. 1). Therefore, the read channel 22 is effectively the inverse of the write channel 10.

Unfortunately, conventional RLL coding techniques often limit the speed at which the channel 22 can read data from the medium 20, and thus limit the data-read speed of the disk drive containing the channel 22 and the medium 20. As discussed above in conjunction with FIG. 1, an RLL code word is relatively inefficient, and this inefficiency limits the effective speed at which the channel 22 can read data from the medium 20. Furthermore, as discussed below in conjunction with FIGS. 3 and 4, an RLL code word may significantly degrade the signal-to-noise ratio (SNR) of the data-read signal. Unfortunately, this inefficiency and the degraded SNR limit the effective speed at which the channel 22 can read data from the medium 20. Therefore, it is difficult if not impossible to realize significant increases in data-read speed using conventional RLL coding techniques.

In conjunction with FIGS. 3–10, a general discussion of conventional data read/write and encoding techniques is included to assist the reader in understanding the subsequently discussed inventive concepts. Numerous detailed discussions of these conventional techniques are included in available references such as "Digital Baseband Transmission" by Jan W. Bergmans.

Referring to FIGS. 3 and 4, conventional RLL encoding techniques and code words are discussed. Generally, RLL code words are stored on a computer disk instead of data words because the code words can be selected to have desirable parameters that the data words will not always have. As discussed below, the read channel 22 (FIG. 2) depends on these parameters for proper operation.

FIG. 3 is a data word 40 and its equivalent RLL code word 42. The word 40 includes data bits $D_0$–$D_a$, and the code word 42 includes code bits $C_0$–$C_b$ and is compatible with an x/y RLL (d/k) code. The parameter x/y is the efficiency of the RLL code, and indicates that the code word 42 encodes x=a+1 data bits with y=b+1 code bits. Therefore, the higher the ratio x/y, the fewer the number of code bits that are written and read for each data bit, and thus the faster the data-write and data-read speeds for a given number of data bits. Conversely, the lower the ratio x/y, the greater the number of code bits that are written and read for each data bit, and thus the slower the data-write and data-read speeds for a given number of data bits. The parameter d is the minimum number of code bits C required between consecutive code-bit transitions, and the parameter k is the maximum number of code bits C allowed between consecutive code-bit transitions. For example, binary code sequences 01 and 10 include 0-to-1 and 1-to-0 code-bit transitions, respectively, and an x/y RLL (0/7) code may include the binary sequence 101000000001, which respectively includes 0 bits (minimum) and 7 bits (maximum) between consecutive code-bit transitions. The Viterbi detector 28 (FIG. 1) includes a state machine having a structure based on the responses of the portion of the read channel 22 that includes the read head 24 and read circuit 26, and possibly on the state sequence of the code if such a state sequence exists. Furthermore, the detector 28 or a separate clock detector (not shown) uses the code-bit transitions to synchronize a read clock signal for sampling the read signal from the read head 24.

FIG. 4 shows the first three code words 42a, 42b, and 42c of a code sequence 44, which is compatible with an 8/9 RLL (0/7) code. Because d=0, there need be no code bits between code-bit transitions. That is, the sequence 44 can have consecutive code-bit transitions such as in the binary series 010101. To insure that the sequence 44 never has more than k=7 code bits between consecutive code-bit transitions, each code word 42a–42c is selected to have at least one respective transition within one or more predefined code-word sections. For example, having at least one transition in both of the code-word sections 46a–46c ($C_0$–$C_3$) and 48a–48c ($C_6$–$C_8$) of each respective code word 42a–42c guarantees that the sequence 44 never has more than 7 bits between consecutive code-bit transitions.

Unfortunately, because they are typically designed to have relatively small error propagations, RLL codes are often relatively inefficient. As discussed above, such inefficiency reduces the data-transfer speeds of the write and read channels 10 and 22 (FIGS. 1 and 2). For example, an 8/9 RLL code word represents 8 bits (a byte) of data. If there is an error in the 9-bit code word, then there is a read error in at most one byte of data. If there is an error that crosses the boundary between two consecutive 8/9 code words, then there is a read error in at most two bytes of data. Thus, the error propagation of the 8/9 RLL code is somewhere between 1 and 2 bytes. On the other hand, because a 16/17 code word represents 2 bytes of data, a code-word error can cause read errors in up to 2 bytes of data, and a cross-boundary error can cause read errors in up to 4 bytes of data. Thus, the error propagation of the 16/17 RLL code is approximately twice that of the 8/9 RLL code. Therefore, even though an RLL code having short code words is typically more inefficient than an RLL code having longer code words, the short-word RLL code is often preferred because it has a smaller error propagation.

Furthermore, because RLL codes are typically designed to reduce the occurrence of a specific type of read error, RLL code sequences often have relatively large numbers of bit transitions. This relatively high rate of bit transitions typically lowers the SNR of the read signal, and thus typically reduces the accuracy and effective speed of the read channel 22 (FIG. 2). For example, a Maximum-Transition-Rate (MTR) code is a popular RLL code that is designed to eliminate or reduce the occurrence of tri-bit read errors, which are three consecutive erroneous code bits. Tri-bit errors typically occur in three-bit sequences that have two bit transitions, such as 101 being erroneously read as 010.

Therefore, MTR codes are typically structured to avoid long sequences of consecutive code-bit transitions. Unfortunately, MTR codes can do very little to increase accuracy if a significant number of the errors are not tri-bit errors.

Referring to FIGS. 5–8, NRZI and NRZ sequences are discussed. As discussed below, the combination of the NRZI-to-NRZ conversion in the write channel 10 (FIG. 1) and the NRZ-to-NRZI conversion in the read channel 22 (FIG. 2) prevents reverse connection of the write head 18 or the read head 24 from causing data errors. Typically, the write head 18 and the read head 24 each have two connection terminals. The polarities of the heads 18 and 24 depend on how these terminals are connected to the write circuit 16 and the read circuit 26, respectively. For example, if connected to have a positive polarity, the write head 18 does not invert the code bits from the circuit 16, and thus writes a logic 0 from the circuit 16 as a logic 0 and writes a logic 1 from the circuit 16 as a logic 1. Conversely, if connected to have a negative polarity, the write head 18 inverts the code bits from the circuit 16, and thus writes a logic 0 from the circuit 16 as a logic 1 and writes a logic 1 from the circuit 16 as a logic 0. A similar analysis can be made for the read head 24. Therefore, if both the write and read heads 18 and 24 are connected to have the same polarity (either positive or negative), then the read data generated by the read channel 22 has the same polarity as the write data input to the write channel 10. But if the write and read heads 18 and 24 are connected to have different polarities, then the read data has the opposite polarity from the write data, and thus a catastrophic read error occurs. Unfortunately, today's manufacturing techniques make such reverse-polarity head connections relatively common. Therefore, as discussed below in conjunction with FIGS. 7 and 8, a NRZI-NRZ-NRZI conversion is used because it cancels out such head-polarity errors.

FIG. 5 is a schematic diagram of the pre-coder 14 (FIG. 1), which converts a NRZI sequence into a NRZ sequence. The pre-coder 14 includes an XOR gate 50, which receives the NRZI sequence of bits on an input terminal 52 and provides a corresponding NRZ sequence of bits on an output terminal 54. The pre-coder 14 also includes a first-order delay 56 connected between an input terminal 58 and the output terminal 54 of the XOR gate 50. Therefore:

$$NRZout_T = NRZlin_T \oplus NRZout_{T-1} \qquad (1)$$

where $\oplus$ is the mathematical symbol for the XOR operation and T represents a discrete point in time.

In operation, any sequence of bits—such as the sequence from the encoder 12 (FIG. 1)—can be arbitrarily labeled as a NRZI sequence, and the pre-coder 14 converts this sequence into a corresponding NRZ sequence of bits.

FIG. 6 is a schematic diagram of the post-coder 30 (FIG. 2), which converts a NRZ sequence into a NRZI sequence. The post-coder 30 includes an XOR gate 60, which receives the NRZ sequence of bits on an input terminal 62 and provides the corresponding NRZI sequence of bits on an output terminal 64. The post-coder 30 also includes a first-order delay 66 connected between the input terminal 62 and another input terminal 68. Therefore:

$$NRZIout_T = NRZin_T \oplus NRZin_{T-1} \qquad (2)$$

In operation, any sequence of bits—such as the sequence from the Viterbi detector 28 (FIG. 2)—can be arbitrarily labeled as a NRZ sequence, and the post-coder 30 converts this sequence into a corresponding NRZI sequence of bits.

As discussed below in conjunction with FIGS. 7 and 8, if the output terminal 54 of the pre-coder 14 (FIG. 5) is coupled to the input terminal 62 of the post-coder 30, then $NRZIin_T = NRZIout_T$.

FIG. 7 is an example of a NRZI-NRZ-NRZI conversion using the pre-coder 14 (FIG. 5) and the post-coder 30 (FIG. 6). Assume a binary NRZI sequence of 010110 and that $NRZT_{T-1}$ (the output of the delay 56 at time T−1)=0. First, the pre-coder 14 performs the NRZI-to-NRZ portion of the conversion starting with the first bit (the right-most bit in this example) of the NRZI sequence and ending with the last bit (the left-most bit in this example) of the NRZI sequence. Therefore, the resulting NRZ sequence is 1100100, which includes $NRZ_{T-1}$ as the first bit. By staggering the NRZ sequence such that its bits are between the bits of the NRZI sequence, one can see that the NRZI sequence is the derivative of the NRZ sequence. That is, wherever $NRZI_T=1$, a transition occurs between the corresponding bits of the NRZ sequence. Conversely, wherever $NRZI_T=0$, no transition occurs between the corresponding bits of the NRZ sequence. For example, the second bit (from the right) of the NRZI sequence is logic 1, and the second and third bits of the NRZ sequence are logic 0 and logic 1, respectively. Thus, $NRZI_{T+1}$=logic 1 indicates that there is a transition between $NRZ_T$ and $NRZ_{T+1}$. Similarly, the fourth bit of the NRZI sequence is logic 0, and the fourth and fifth bits of the NRZ sequence are logic 0. Thus, $NRZI_{T+3}$=logic 0 indicates that there is no transition between $NRZ_{T+2}$ and $NRZ_{T+3}$. Next, the post-coder 30 performs the NRZ-to-NRZI portion of the conversion starting with the first (right-most) bit of the NRZ sequence and ending with the last (left-most) bit. Therefore, the resulting NRZI sequence is 010110, which is the same NRZI sequence we started with.

FIG. 8 illustrates the ability of the NRZI-NRZ-NRZI conversion to cancel negative head polarities. For example, if either the write head 18 (FIG. 1) or the read head 24 (FIG. 2)—but not both—is connected to have a negative polarity, then the Viterbi detector 28 (FIG. 2) generates $\overline{NRZ}$. But despite this inversion, the post-coder 30 recovers the original NRZI sequence 010110.

Referring to FIG. 9, parity is a technique used to detect errors in uncoded data. For example, before a binary data byte D is transmitted, it is assigned a parity bit P whose value depends on the values of the bits $D_0$–$D_7$. The combination of D and P forms a 9-bit parity word 72. For even parity, the value of P is such that the total number of "1's" in the word 72 is even. Therefore, if the number of "1's" in D is odd, then P=1. Likewise, if the number of "1's" in D is even, then P=0. For odd parity, the value of P is such that the total number of "1's" in the word 72 is odd. Therefore, if the number of "1's" in D is odd, then P=0. Likewise, if the number of "1's" in D is even, then P=1. For example, if D=10101010, then there are four "1's" in D. Therefore, P=0 for even parity and P=1 for odd parity. Similarly, if D=10101011, then there are five "1's" in D. Therefore, P=1 for even parity and P=0 for odd parity. The word 72 is then transmitted to a decoder (not shown) that checks the parity of the word 72. If the parity is incorrect, then the decoder identifies the word 72 as including an error. One may then attempt to recover the correct value of D using conventional error-correction techniques.

Although parity is widely used for error detection in uncoded data, it is rarely, if ever, used for error detection in RLL coded data.

SUMMARY OF THE INVENTION

In one aspect of the invention, a code word includes a first group of data bits and includes code bits that represent a second group of data bits. In another aspect of the invention, there is a minimum probability of bit transitions among the code bits. In yet another aspect of the invention, the code word includes a parity bit.

Unlike conventional codes, a code that includes such a code word can have both a high efficiency and a small error propagation. Additionally, by including fewer bit transitions, a sequence of such code words causes less read noise, and thus causes fewer read errors as compared to sequences of known code words. Moreover, such a code word can include a parity bit to allow improved error detection as compared to known error-detection techniques for coded data.

DETAILED DESCRIPTION OF THE INVENTION

Figure 10:
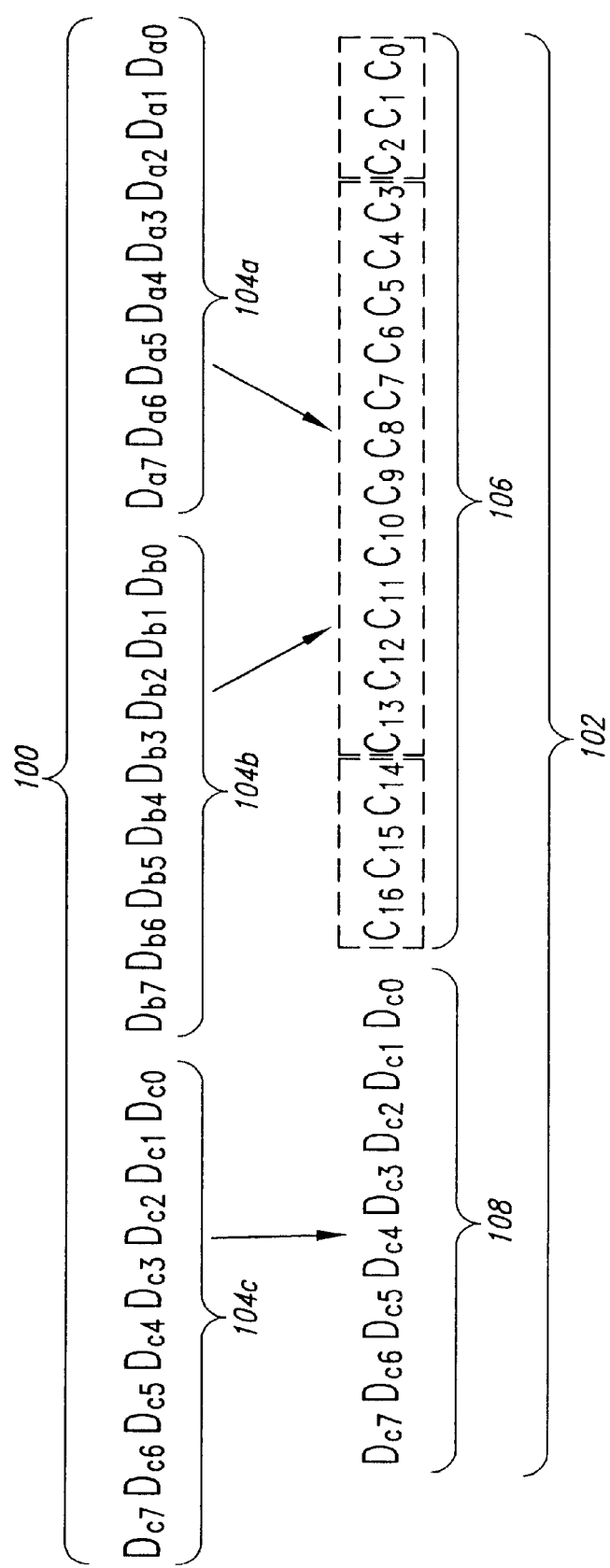
FIG. 10 is a diagram of a data word and a corresponding code word according to an embodiment of the invention.

FIG. 10 is a diagram of a data word 100 and a corresponding RLL code word 102 according to an embodiment of the invention. As discussed below, a sequence of code words 102 is significantly more efficient and contains significantly fewer code-bit transitions than sequences of prior code words. Furthermore, the error propagation of the associated RLL code is relatively small even though the code efficiency is relatively high. Therefore, a write channel can typically write a sequence of such code words more quickly than it can write a sequence of conventional code words, and a read channel can typically read a sequence of such code words more quickly than it can read a sequence of conventional code words.

In one embodiment, the data word 100 includes three data bytes 104a, 104b, and 104c, and the code word 102 is a 24/25 RLL (0/14) code word that includes a coded portion 106 and an uncoded portion 108. The coded portion 106 includes a number of code bits C, here seventeen code bits $C_0$–$C_{16}$, which represent the data bytes 104a and 104b. Conversely, the uncoded portion 108 does not include code bits, but instead includes the data bits $D_{C0}$–$D_{C7}$ of the data byte 104c. That is, the uncoded portion 108 is identical to the data byte 104c. To insure that a sequence of code words 102 never has more than 14 bits between consecutive transitions, the coded portion 106 is selected such that there is at least one transition within each of the following sections of code bits: the first three bits $C_0$–$C_2$, the middle eleven bits $C_3$–$C_{13}$, and the last three bits $C_{14}$–$C_{16}$. In other embodiments, however, the code word 102 can have different x/y and d/k ratings, the coded and uncoded portions 106 and 108 can have different lengths, and the coded portion 106 can have different code-bit transition sections.

Figure 4:
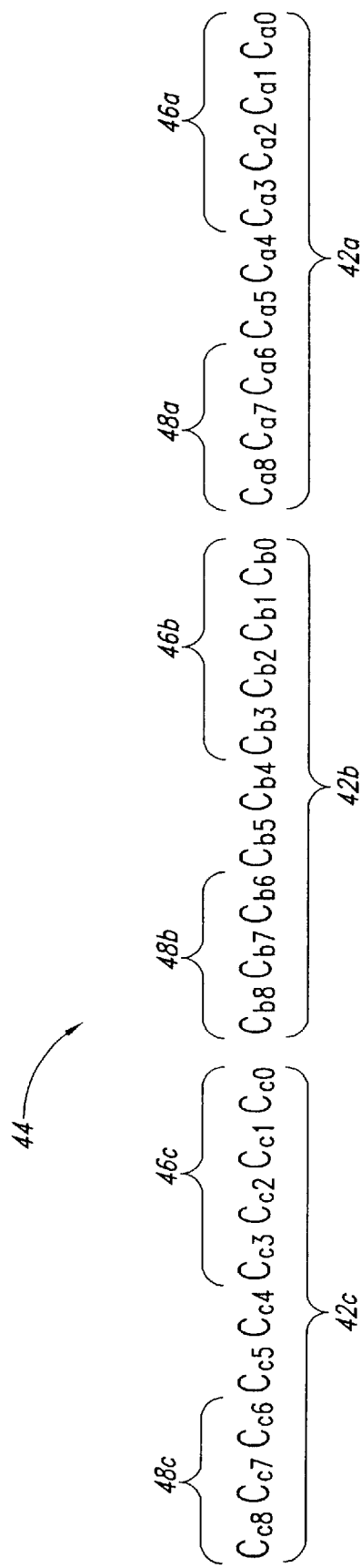
FIG. 4 is a diagram of a RLL code word according to the prior art.

In addition to having a higher efficiency than a sequence of conventional code words, a sequence of code words 102 also has a lower error propagation with respect to its efficiency than a sequence of conventional code words. This lower error propagation is due to the code word 102 having two portions instead of only one portion. For example, an error in the uncoded portion 108 causes a data error in at most one data byte 104c. Likewise, an error in the coded portion 106 causes a data error in at most two data bytes 104a and 104b. Furthermore, because the coded portions 106 are separated by the uncoded portions 108 in a sequence of code words 102, a cross-boundary error causes a data error in at most three data bytes 104a, 104b, and 104c. Therefore, compared to a sequence of conventional code words such as the 16/17 code word discussed in conjunction with FIG. 4, a sequence of the code words 102 has a significantly higher efficiency (24/25 versus 16/17) and a significantly lower error propagation (between 1 and 3 bytes versus between 2 and 4 bytes). Furthermore, as discussed below, the code words 102 can be constructed so that a sequence of code words 102 has an even lower error propagation.

Still referring to FIG. 10, in another embodiment of the invention, the code word 102 is designed according to a Minimal Transition Probability (MTP) RLL coding scheme in which the coded portion 106 is selected to have the fewest possible transitions in the form—typically the NRZ form—in which it will be stored. This increases the SNR of the read signal, and thus improves the initial reading accuracy, and thus the effective read speed, of a read channel that reads a sequence of code words 102. Specifically, it has been found that contrary to the prior-art teachings, a combination of single-bit and tri-bit errors compose approximately 99% of all initial read errors, with single-bit errors composing approximately 80% of all initial read errors and with tri-bit errors composing merely 19% of all initial read errors. Therefore, to provide the greatest overall reduction in total initial read errors, it is clear that a code should be designed to cause as few single-bit errors as possible. It has also been found that a major cause of single-bit errors is bit transitions in the sequence of code words being read. That is, the more transitions the more single-bit errors, and the fewer transitions the fewer single-bit errors. Therefore, it follows that all else being equal, sequences of code words having the fewest code-bit transitions cause the fewest read errors on average. In accordance with these findings, the inventors developed the MTP RLL coding scheme.

For example purposes, the development process for a 24/25 MTP RLL (0/14) code having code words 102 is discussed, it being understood that similar processes can be used to develop other MTP RLL codes.

Figure 8:
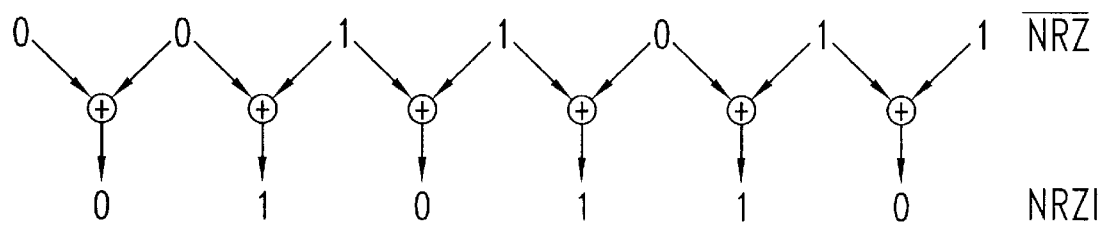
FIG. 8 is a diagram of an example $\overline{NRZ}$-NRZI conversion performed by the post-coder of FIG. 6.

First, the code designer selects the coded portions 106 having the fewest possible transitions. Because they include 17 code bits, there are $2^{17}$ possible coded portions 106. But because these portions 106 represent respective pairs of data bytes 104a and 104b (16 data bits total), only half ($2^{16}$) of the possible portions 106 are used. Therefore, the designer first discards all the code portions 106 that do not have at least one transition in each of the following transition sections: $C_0$–$C_2$, $C_3$–$C_{13}$, and $C_{14}$–$C_{16}$. Because they will be converted from the NRZI to the NRZ domain for storage, the code portions 106 are selected such that they have this transition pattern in the NRZ domain. As stated above in conjunction with FIG. 8, a "1" in an NRZI sequence indicates a transition in a corresponding NRZ sequence. Therefore, by discarding the code words that don't have at least one "1" in each of the transition sections, the designer discards the coded portions 106 that do not meet the given transition requirement in the NRZ domain. From the remaining coded portions 106, the designer selects the $2^{16}$ that have the fewest bit transitions in the NRZ domain. Again, he does this by selecting the $2^{16}$ coded portions 106 having the fewest "1's".

Next, the designer assigns the selected coded portions 106 to corresponding 16-bit (two byte) data words in such a way that the 24/25 MTP RLL (0/14) code has a reduced error propagation. Specifically, the designer assigns a coded portion 106 to a data word such that an error in one section of the coded portion 106 causes an error in only one of the corresponding data bytes 104a and 104b. For example, consider the following assignments in Table A.

TABLE A

| 17-bit Coded Portion | 16-bit Data Word |
| --- | --- |
| 10000000000100001 | 1111111100000000 |
| 01000000000100001 | 1001001100000000 |

Suppose that only coded portions 106 ending in 00100001 (last 8 bits) are assigned to data words ending in 00000000. That is, the decoder (not shown in FIG. 10) "knows" that any coded portion ending in 00100001 represents a data word having a data byte 104a equal to 00000000. Therefore, an error in the most significant 9 bits of these coded portions 106 would cause an error in at most one data byte, i.e., the most significant byte 104b of the data word. This reduces the error propagation of a series of such code words 102 because not all errors in the coded portions 106 will cause errors in two data bytes.

Appendix A lists $2^{16}$ coded portions 106 for a 24/25 MTP RLL (0/14) code developed according to an embodiment of the above-described process. The coded portions 106 are in hexadecimal form, and are in row order with respect to the 16-bit data words that they represent. For example, data word 0000000000000000 is represented by the coded portion 15B49, which is in the upper left-hand corner of page 1 of Appendix A. Likewise, the data word 0000000000000001 is represented by the coded portion 04103, and so on.

Furthermore, because the uncoded portions 108 are identical to the data bytes 104c, the portions 108 are not preselected.

Figure 9:
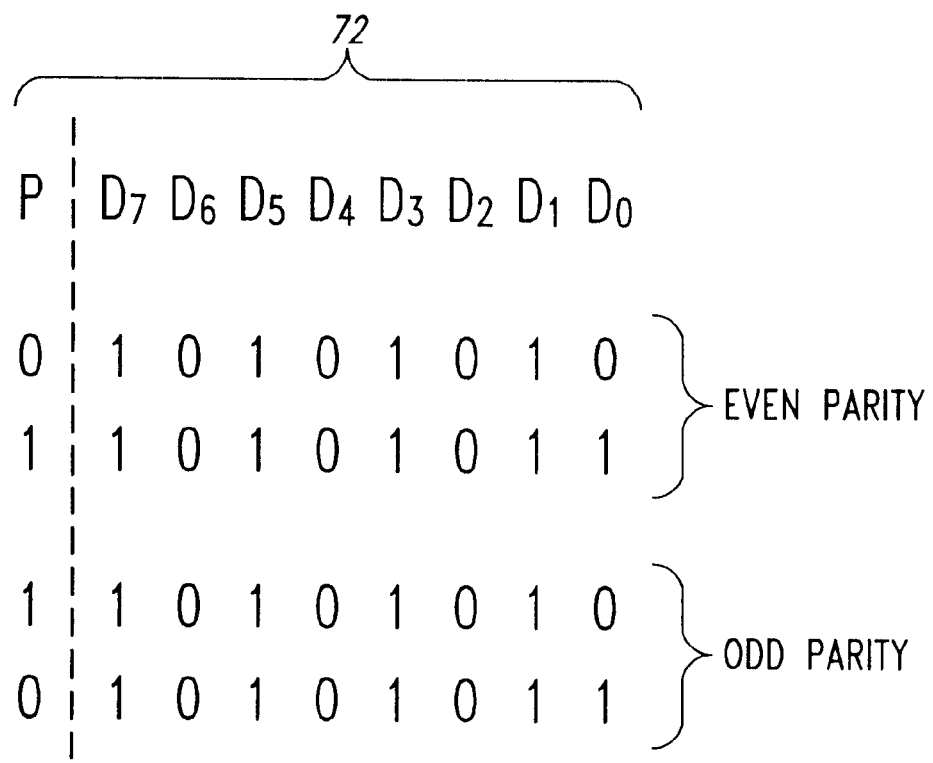
FIG. 9 is a diagram of a parity word according to the prior art.
Figure 11:
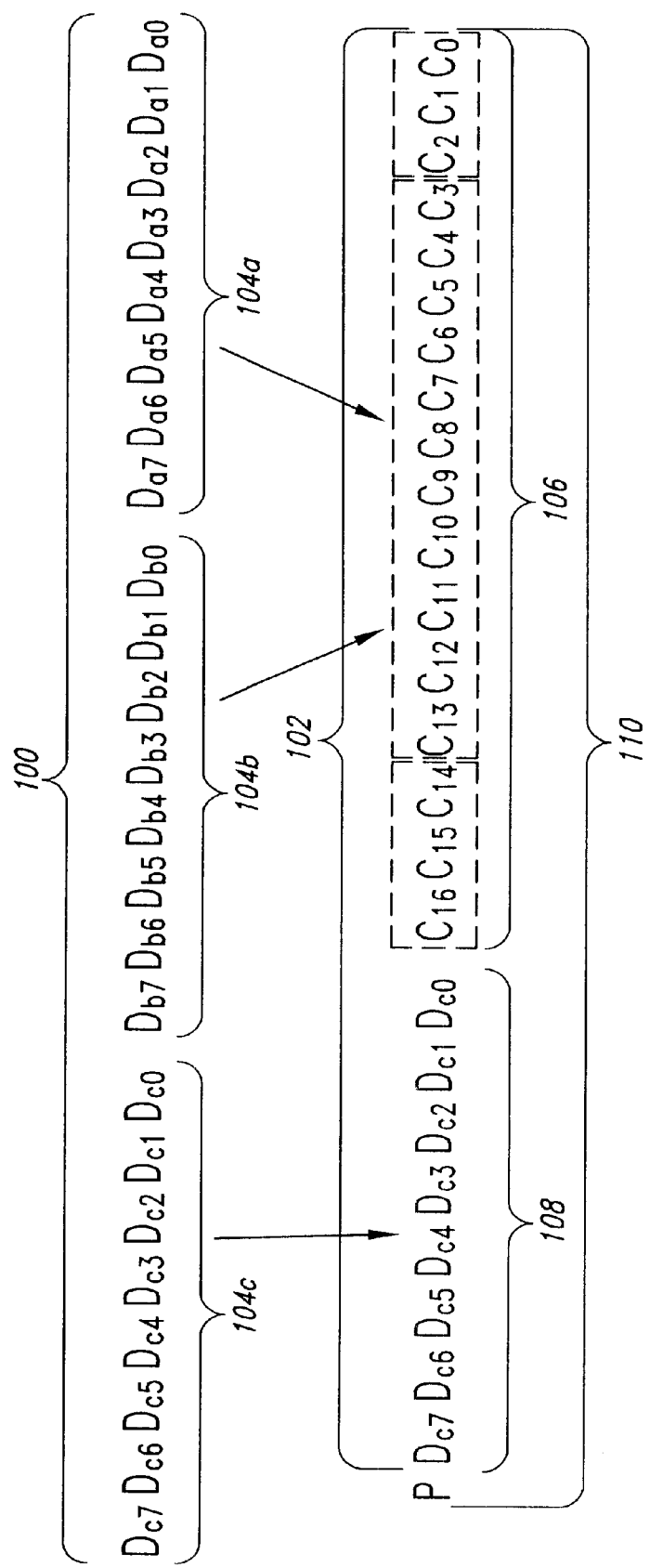
FIG. 11 is a diagram of a data word and a corresponding parity code word according to an embodiment of the invention.

FIG. 11 is a diagram of the data word 100 and a corresponding RLL parity code word 110, which includes a parity bit P according to an embodiment of the invention. In one embodiment, the code word 110 includes the code word 102 (FIG. 10) and a parity bit P, and is thus compatible with a 24/26 MTP RLL (0/14) code. Therefore, in addition to the advantages discussed above for a sequence of the code words 102, a sequence of the parity code words 110 provides the error-detecting advantages discussed above in conjunction with FIG. 9.

The parity bit P is calculated in either the NRZ or NRZI domain to provide the proper parity with respect to the code word 110 in the NRZ domain. This allows a Viterbi detector to check for read errors by checking the parity of the code word 110.

Figure 5:
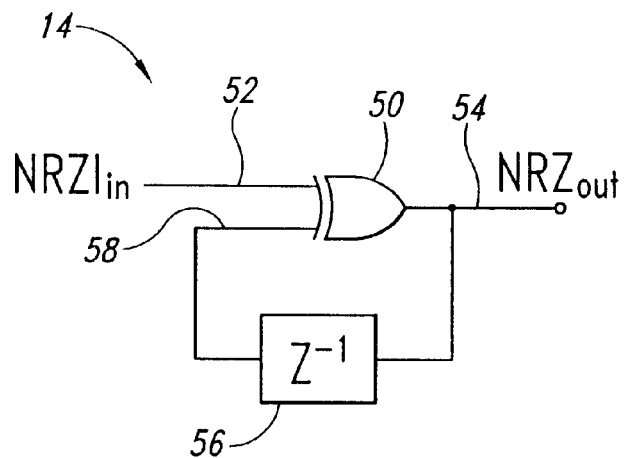
FIG. 5 is a schematic diagram of the pre-coder of FIG. 1.
Figure 6:
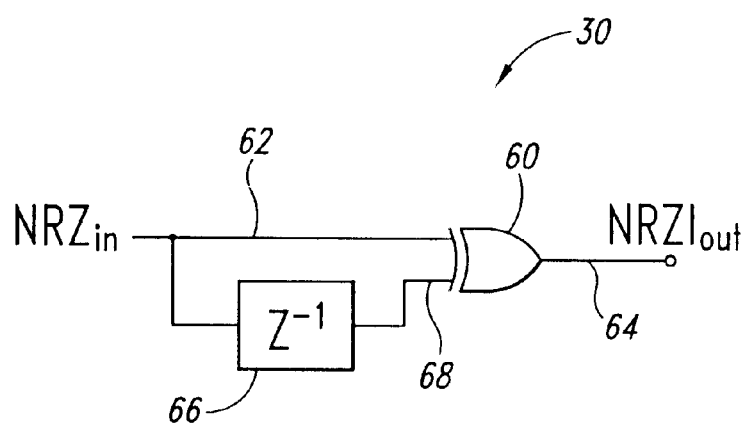
FIG. 6 is a schematic diagram of the post-coder of FIG. 2.
Figure 7:
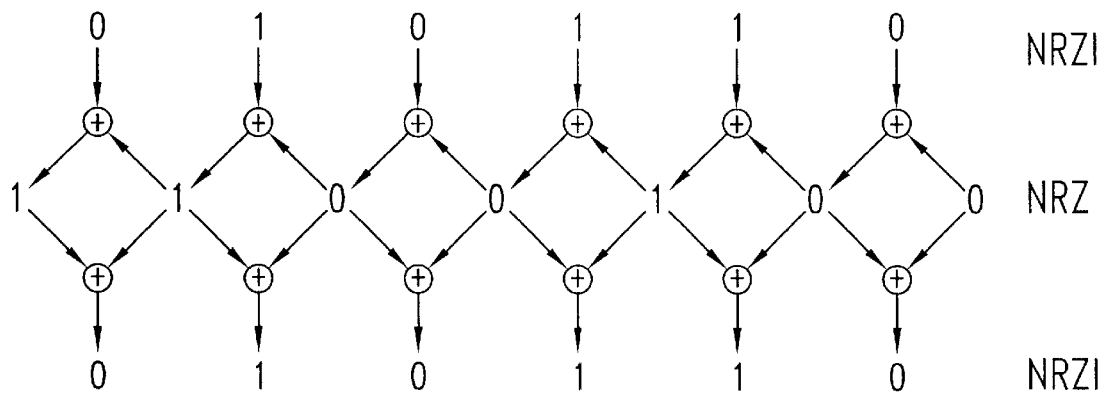
FIG. 7 is a diagram of an example NRZI-NRZ-NRZI conversion performed by the pre-coder of FIG. 5 and the post-coder of FIG. 6.

To calculate the parity bit P in the NRZ domain, one first converts the coded and uncoded portions 106 and 108— which are initially in the NRZI domain—into the NRZ domain. The parity-bit calculation is then the same as that discussed above in conjunction with FIG. 5.

To calculate the parity bit P in the NRZI domain, one must take into account how the NRZI-to-NRZ conversion will affect the values of P and the other bits of the code word 110. According to one technique for generating the code word 110 having even parity, P in the NRZI domain ($P_{evenNRZI}$) equals the sum of every other bit of the code word 102 (i.e., every other bit of the code word 110 other than P) starting with $C_1$. Thus, where the code word 102 is 25 bits long, $P_{evenNRZI}$ is given by the following equation:

$$P_{evenNRZI} = C_1 \oplus C_3 \oplus C_5 \oplus C_7 \oplus C_9 \oplus C_{11} \oplus C_{13} \oplus C_{15} \oplus D_{C0} \oplus D_{C2} \oplus D_{C4} \oplus D_{C6} \quad (3)$$

For example, if the code word 102 is 1001110001110011110000110, then $P_{evenNRZI}$ = 1⊕0⊕0⊕1⊕1⊕0⊕1⊕1⊕0⊕1⊕1⊕0=1. Therefore, the code word 110 equals 11001110001110011110000110 in the NRZI domain. Using the pre-coder 14 (FIG. 5) and assuming that $NRZout_{T-1}=0$, the code word 110 equals 01000101111010001010000010 in the NRZ domain. There are ten "1's" in the first 25 bits (i.e., all the bits except the parity bit P), and $P_{evenNRZ}=0$ to provide even parity in the NRZ domain as desired.

This parity-calculation technique is derived as follows, where X represents the bits of the code word 110 in the NRZI domain, Y represents the bits of the code word 110 in the NRZ domain, $S=NRZout_{T-1}$, and B equals the number of bits Y in the code word 110.

$$\{Y_0, Y_1, \ldots, Y_{B-1}\} = \{S \oplus X_0, S \oplus X_0 \oplus X_1, \ldots, S \oplus X_0 \oplus X_1 \oplus \cdots \oplus X_{B-1}\} \quad (4)$$

$$\text{Parity} = Y_0 \oplus Y_1 \oplus \cdots \oplus Y_{B-1} \quad (5)$$

Therefore, substituting the NRZI (X) values for the NRZ (Y) values we get:

$$\text{Parity} = [B \oplus S] \oplus [B \oplus X_0] \oplus [(B-1) \oplus X_1] \oplus \cdots \oplus [2 \oplus X_{B-2}] \oplus X_{B-1} \quad (6)$$

where ⊕ represents mod2 multiplication such that q⊕r=0 if q is an even number and q⊕r=r if q is an odd number. If q={B, B−1, ..., 1} and B is an even number, then it follows that:

$$\text{Parity} = \left| \sum_{n=1}^{B/2} X_{2n-1} \right|_{mod2} \quad (7)$$

Because the parity bit is the last element of the right-hand side of equation (7), $P_{evenNRZI}$ equals the logical sum of all the other elements. So for even parity:

$$P_{evenNRZI} = \left| \sum_{n=1}^{B/2-1} X_{2n-1} \right|_{mod2} \quad (8)$$

A similar formula can be derived for odd parity.

Figure 1:
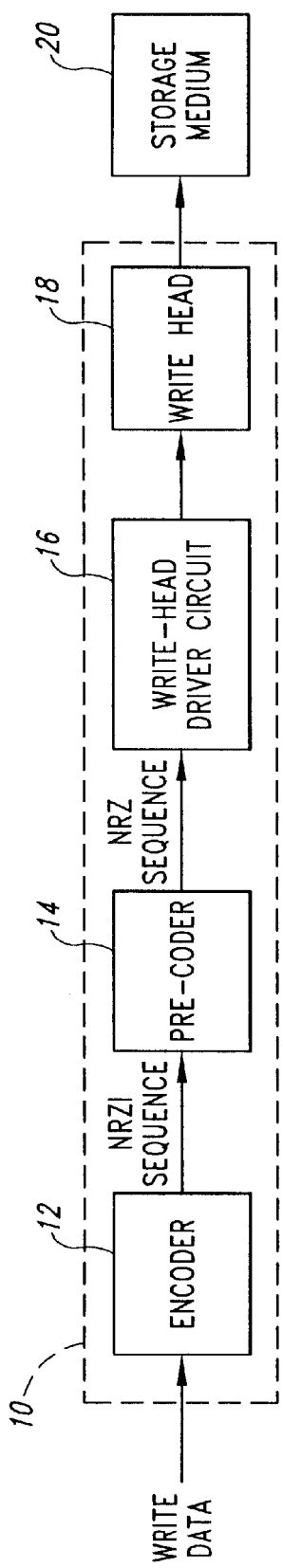
FIG. 1 is a block diagram of a data write channel and a storage medium according to the prior art.
Figure 12:
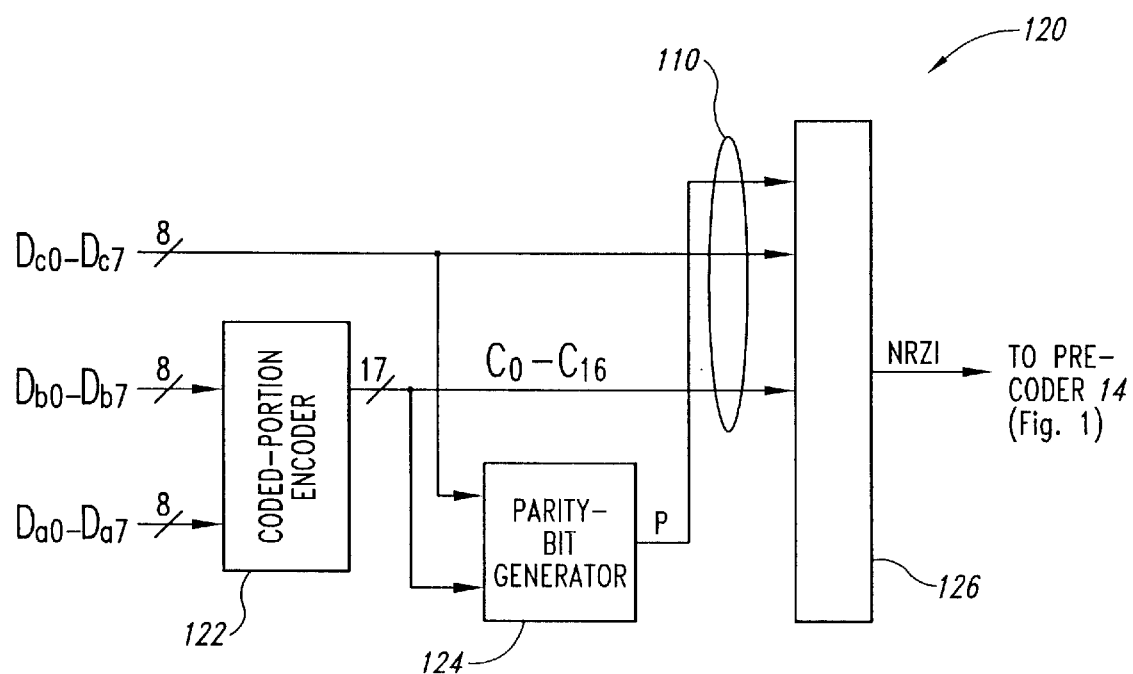
FIG. 12 is a block diagram of a data encoder according to an embodiment of the invention.

FIG. 12 is a block diagram of a data encoder 120 according to an embodiment of the invention. For example, the encoder 120 can replace the encoder 12 in the write channel 10 of FIG. 1. Referring to FIGS. 11 and 12, the encoder 120 includes a coded-portion encoder 122, which receives the data bytes 104a ($D_{a0}-D_{a7}$) and 104b ($D_{b0}-D_{b7}$) in parallel and converts them into the coded portion 106 ($C_0-C_{16}$) of the code word 110. A parity-bit generator 124 receives the uncoded portion 108 ($D_{c0}-D_{c7}$) and the coded portion 106 in parallel and generates the parity bit P therefrom. In one embodiment, the generator 124 calculates P for even parity using the technique described above in conjunction with FIG. 11. The encoder 120 also includes a conventional parallel-to-serial converter 126, which receives the code word 110 in parallel and converts it into a 1-bit wide NRZI bit stream. In one embodiment, this bit stream is processed by a pre-coder such as the pre-coder 14 of FIG. 5. Furthermore, the encoder 120 can be modified to generate only the code word 102 (i.e., the code word 110 without the parity bit P) by omitting or deactivating the generator 124.

Figure 2:
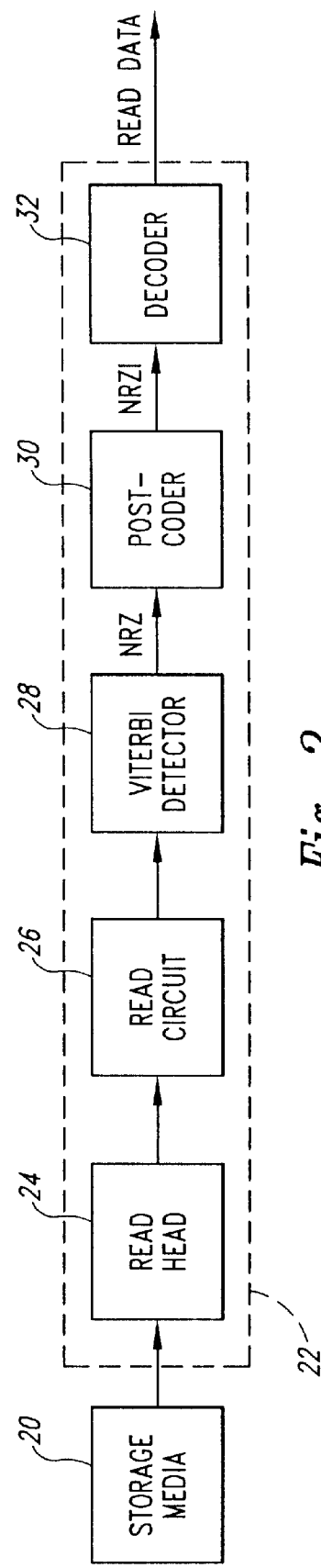
FIG. 2 is a block diagram of a data read channel and a storage medium according to the prior art.
Figure 3:
FIG. 3 is a diagram of a data word and a corresponding code word according to the prior art.
Figure 13:
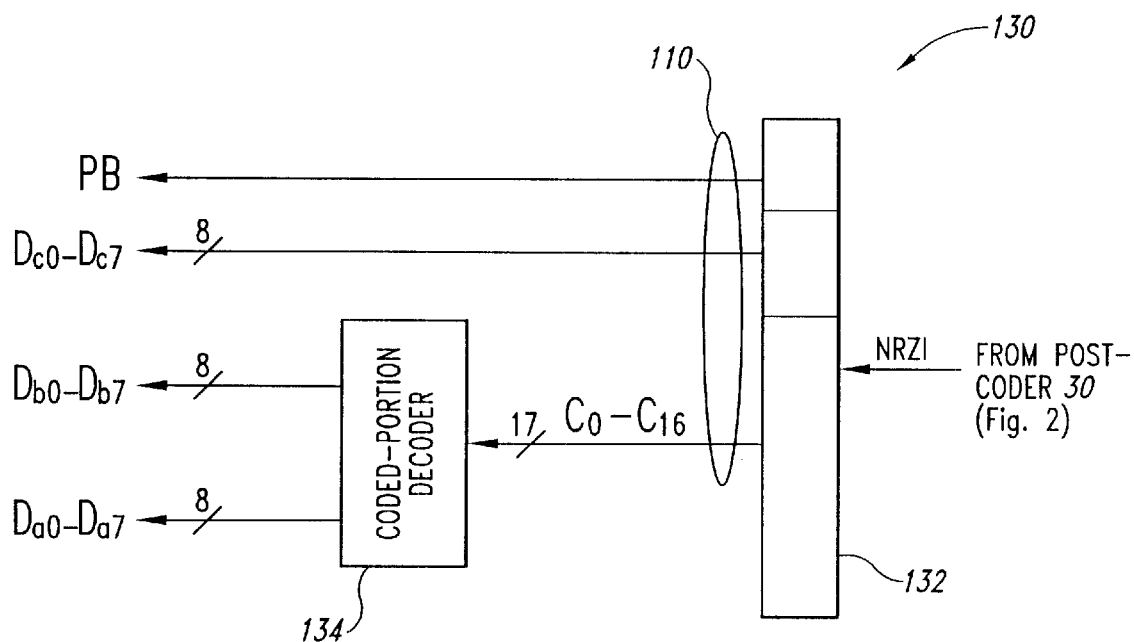
FIG. 13 is a block diagram of a data decoder according to an embodiment of the invention.

FIG. 13 is a block diagram of a data decoder 130 according to an embodiment of the invention. For example, the decoder 130 can replace the decoder 132 in the read channel 22 of FIG. 2. Referring to FIGS. 11 and 12, the decoder 130 includes a conventional serial-to-parallel converter 132, which receives the NRZI bit stream from a post-coder such as the post-coder 30 (FIG. 2) and which converts the bit stream into the code word 110. A coded-portion decoder 134 receives the coded portion 106 ($C_0-C_{16}$) of the code word 110 from the converter 132 and decodes it into the data bytes 104a ($D_{a0}-D_{a7}$) and 104b ($D_{b0}-D_{b7}$). Therefore, assuming there are no write or read errors, the decoder 130 provides the originally encoded bytes data 104a, 104b, and 104c ($D_{c0}-D_{c7}$) at its output. In one embodiment, the parity bit P is analyzed only by a parity-checking Viterbi detector, an embodiment of which is disclosed in U.S. patent application Ser. No. 09/409,923 PARITY-SENSITIVE VITERBI DETECTOR AND METHOD FOR RECOVERING INFORMATION FROM A READ SIGNAL, Therefore, in such an embodiment, the converter 132 may strip P from the code word 110.

Figure 14:
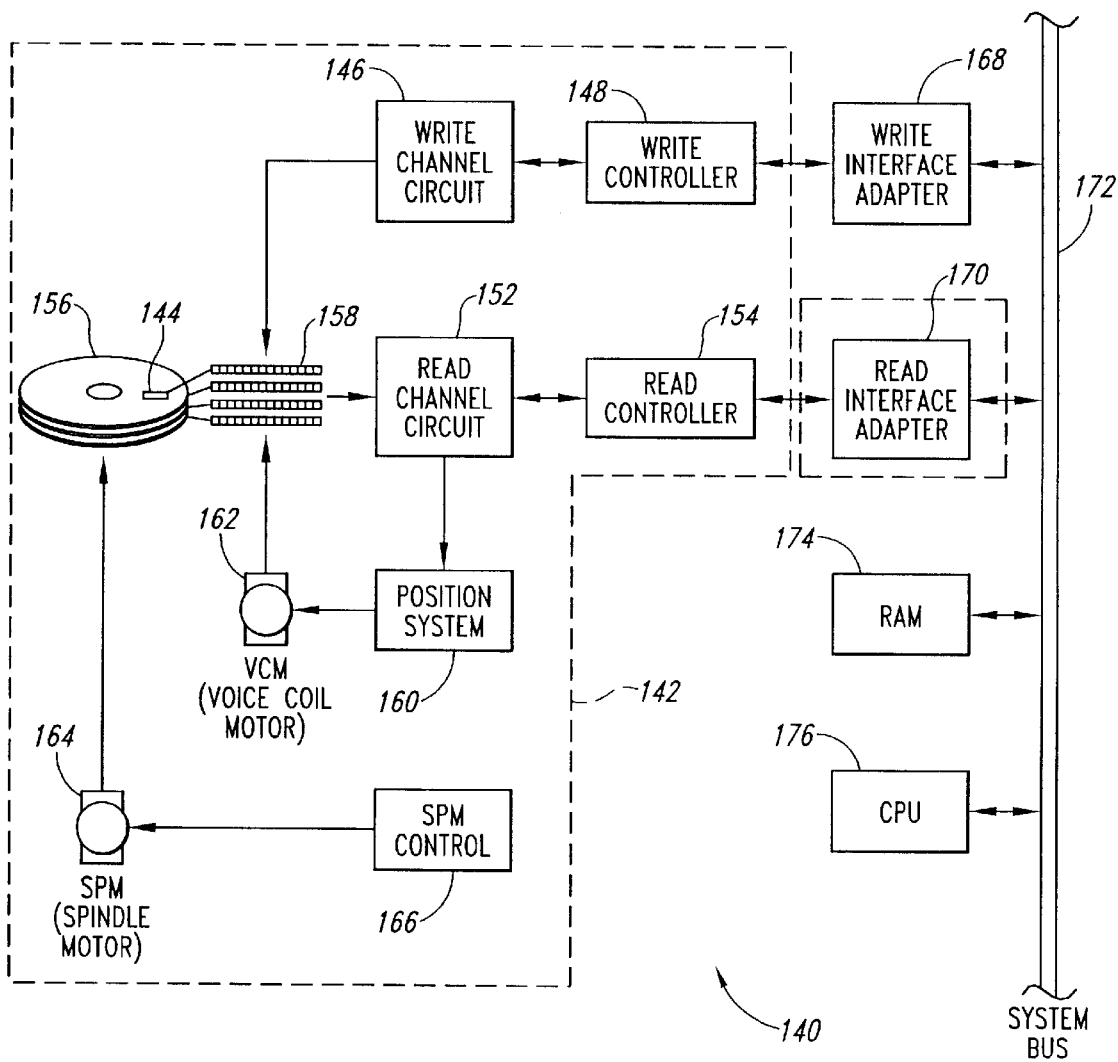
FIG. 14 is a block diagram of a disk-drive system that incorporates the data encoder of FIG. 12, the data decoder of FIG. 13, or both.

FIG. 14 is a block diagram of a disk-drive system 140 according to an embodiment of the invention. Specifically, the disk-drive system 140 includes a disk drive 142, which incorporates the encoder 120 or the decoder 130 of FIGS. 12 and 13, respectively. The disk drive 142 includes a combination write/read head 144, a write-channel circuit 146 for generating and driving the head 144 with a write signal, and a write controller 148 for interfacing the write data to the write-channel circuit 146. In one embodiment, the write-channel circuit 146 is similar to the write channel 10 of FIG. 1 except that the write head 18 is omitted and the encoder 12 is replaced with the encoder 120. The disk drive 142 also includes a read-channel circuit 152 for receiving a read signal from the head 144 and for recovering the written data from the read signal, and includes a read controller 154 for organizing the read data. In one embodiment, the read-channel circuit 152 is similar to the read channel 22 of FIG. 2 except that the read head 24 is omitted, the decoder 32 is replaced with the decoder 130, and the Viterbi detector 28 is replaced with the parity-checking Viterbi detector of U.S. patent application Ser. No. 09/409,923 entitled PARITY-SENSITIVE VITERBI DETECTOR AND METHOD FOR RECOVERING INFORMATION FROM A READ SIGNAL. The disk drive 142 further includes a storage medium such as one or more disks 156, each of which may contain data on one or both sides. The write/read head 144 writes/reads the data stored on the disks 156 and is connected to a movable support arm 158. A position system 160 provides a control signal to a voice-coil motor (VCM) 162, which positionally maintains/moves the arm 158 so as to positionally maintain/radially move the head 144 over the desired data on the disks 156. A spindle motor (SPM) 164 and a SPM control circuit 166 respectively rotate the disks 156 and maintain them at the proper rotational speed.

The disk-drive system 140 also includes write and read interface adapters 168 and 170 for respectively interfacing the write and read controllers 148 and 154 to a system bus 172, which is specific to the system used. Typical system busses include ISA, PCI, S-Bus, Nu-Bus, etc. The system 140 also typically has other devices, such as a random access memory (RAM) 174 and a central processing unit (CPU) 176 coupled to the bus 172.

From the foregoing it will be appreciated that, although specific embodiments of the invention have been described herein for purposes of illustration, various modifications may be made without deviating from the spirit and scope of the invention.

What is claimed is:

1. A code word, comprising:
a first group of data bits, the first group including a single continuous sequence of all the data bits that compose the code word; and
a single continuous sequence of code bits that represent a second group of data bits, the single continuous sequence of code bits including all of the code bits that compose the code word.

2. A code word, comprising:
a first group of data bits;
code bits that represent a second group of data bits; and
wherein the number of code bits is greater than the number of data bits in the second group.

3. A code word, comprising:
a first group of data bits;
code bits that represent a second group of data bits; and
wherein the code bits form a sequence that is selected from a subgroup of all usable code-bit sequences, each of the sequences in the subgroup having the same number of or fewer bit transitions than each of the usable sequences outside of the subgroup.

4. A code word, comprising:
an uncoded portion that includes a first group of data bits, the uncoded portion including a single continuous sequence of all the data bits that compose the code word; and
a coded portion that represents second and third groups of data bits, the coded portion including a single continuous sequence of code bits that includes all of the code bits that compose the code word.

5. A code word, comprising:
an uncoded portion that includes a first group of data bits;
a coded portion that represents second and third groups of data bits;
wherein the uncoded portion includes a non-return-to-zero sequence of the first group of data bits; and
wherein the coded portion includes a non-return-to-zero sequence of code bits.

6. A code word, comprising:
an uncoded portion that includes a first group of data bits;
a coded portion that represents second and third groups of data bits;
wherein the uncoded portion includes a non-return-to-zero-interleave sequence of the first group of data bits; and
wherein the coded portion includes a non-return-to-zero-interleave sequence of code bits.

7. A code word, comprising:
an uncoded portion that includes a first group of data bits;
a coded portion that represents second and third groups of data bits;
wherein the second group includes a first number of data bits;
wherein the third group includes a second number of data bits; and wherein the coded portion includes a number of code bits that is greater than the sum of the first and second numbers.

8. A code word, comprising:
an uncoded portion that includes a first group of data bits;
a coded portion that represents second and third groups of data bits; and
wherein the coded portion comprises first and second sections of code bits, the coded portion structured such that an erroneous code bit in the first section causes no decoding error with respect to the second group of data bits and such that an erroneous code bit in the second section causes no decoding error with respect to the third group of data bits.

9. A code word, comprising:
a first byte of data bits; and
code bits that represent second and third bytes of data bits.

10. A code word, comprising:
a first byte of data bits; and
seventeen code bits that represent second and third bytes of data bits.

11. A code word, comprising:
a first byte of data bits;
seventeen code bits that represent second and third bytes of data bits;
a first code-bit transition within the first three of the seventeen code bits;
a second code-bit transition within the eleven code bits following the first three code bits; and
a third code-bit transition within the last three code bits.

12. A code word, comprising:
a first byte of data bits;
seventeen code bits that represent second and third bytes of data bits; and
no more than seven code-bit transitions within the seventeen code bits.

13. A code word for storage on a magnetic storage media, the code word comprising:
code bits that represent a group of data bits; and
a parity bit that gives the code word a predetermined parity.

14. A code word for storage on a magnetic storage media, the code word comprising:
code bits that represent a group of data bits; and
a parity bit that provides parity with respect to a non-return-to-zero sequence of the code bits.

15. A code word, comprising:
an uncoded portion that includes a first group of data bits;
a coded portion that represents a second group of data bits; and
a parity bit.

16. The code word of claim 15 wherein:
the uncoded portion includes a non-return-to-zero sequence of the first group of data bits;
the coded portion includes a non-return-to-zero sequence of code bits; and
the parity bit provides parity with respect to the non-return-to-zero sequences of the first group of data bits and the code bits.

17. The code word of claim 15 wherein:
the uncoded portion includes a non-return-to-zero-interleave sequence of the first group of data bits;

the coded portion includes a non-return-to-zero-interleave sequence of code bits; and the parity bit provides parity with respect to non-return-to-zero sequences of the first group of data bits and the code bits.

18. An encoder for encoding data, the encoder operable to generate a code word comprising:

a first group of data bits, the first group including a single continuous sequence of all the data bits that compose the code word; and a single continuous sequence of code bits that represent a second group of data bits, the single continuous sequence of code bits including all of the code bits that compose the code word.

19. An encoder for encoding data, the encoder operable to generate a code word comprising:

a first group of data bits;

code bits that represent a second group of data bits;

wherein the second group includes a number of data bits; and wherein the number of code bits is greater than the number of data bits.

20. An encoder for encoding data, the encoder operable to generate a code word comprising:

a first group of data bits;

code bits that represent a second group of data bits; and a minimum probability of transitions among the code bits.

21. An encoder for encoding data, the encoder operable to generate a code word comprising:

a first group of data bits;

code bits that represent a second group of data bits; and a non-return-to-zero-interleave sequence of the first group of data bits and the code bits.

22. An encoder for encoding data, the encoder operable to generate a code word comprising:

a first byte of data bits; and code bits that represent second and third bytes of data bits.

23. An encoder for encoding data, the encoder operable to generate a code word comprising:

a first group of data bits; and seventeen code bits that represent a second group of data bits.

24. An encoder for encoding data, the encoder operable to generate a code word comprising:

a first group of data bits;

a sequence of seventeen code bits that represents a second group of data bits;

a first code-bit transition within the three code bits at the beginning of the sequence;

a second code-bit transition within the eleven code bits in the middle of the sequence; and a third code-bit transition within the three code bits at the end of the sequence.

25. An encoder for encoding data, the encoder operable to generate a code word comprising:

a first group of data bits;

seventeen code bits that represent a second group of data bits; and no more than seven code-bit transitions within the seventeen code bits.

26. An encoder for encoding data, the encoder operable to generate a code word comprising:

a first group of data bits;

code bits that represent a second group of data bits; and a parity bit.

27. An encoder for encoding data, the encoder operable to generate a code word comprising:

a non-return-to-zero-interleave sequence of a first group of data bits;

a non-return-to-zero-interleave sequence of code bits that represent a second group of data bits; and a parity bit that provides parity with respect to a non-return-to-zero sequence of the first group of data bits and the code bits.

28. A decoder operable to decode a code word comprising:

a first group of data bits, the first group including a single continuous sequence of all the data bits that compose the code word; and a single continuous sequence of code bits that represents a second group of data bits, the single continuous sequence of code bits including all of the code bits that compose the code word.

29. A decoder operable to decode a code word comprising:

a first group of data bits;

code bits that represent a second group of data bits;

wherein the second group includes a number of data bits; and wherein the number of code bits is greater than the number of data bits.

30. A decoder operable to decode a code word comprising:

a first group of data bits;

code bits that represent a second group of data bits; and a minimum probability of transitions among the code bits.

31. A decoder operable to decode a code word comprising:

a non-return-to-zero-interleave sequence of a first group of data bits; and a non-return-to-zero-interleave sequence of code bits that represent a second group of data bits.

32. A decoder operable to decode a code word comprising:

a first byte of data bits; and code bits that represent second and third bytes of data bits.

33. A decoder operable to decode a code word comprising:

a first group of data bits; and seventeen code bits that represent a second group of data bits.

34. A decoder operable to decode a code word comprising:

a first group of data bits;

a sequence of seventeen code bits that represents a second group of data bits;

a first code-bit transition within the three code bits at the beginning of the sequence;

a second code-bit transition within the eleven code bits in the middle of the sequence; and a third code-bit transition within the three code bits at the end of the sequence.

35. A decoder operable to decode a code word comprising:
- a first group of data bits;
- seventeen code bits that represent a second group of data bits; and
- no more than seven code-bit transitions within the seventeen code bits.

36. A decoder operable to decode a code word comprising:
- a first group of data bits;
- code bits that represent a second group of data bits; and
- a parity bit.

37. A decoder operable to decode a code word comprising:
- a non-return-to-zero-interleave sequence of a first group of data bits;
- a non-return-to-zero-interleave sequence of code bits that represent a second group of data bits; and
- a parity bit that provides parity with respect to a non-return-to-zero sequence of the first group of data bits and the code bits.

38. A method, comprising:
- generating code bits;
- summing the code bits in every other bit position; and
- generating a parity bit equal to the sum.

39. The method of claim 38 wherein:
- the generating comprises generating a non-return-to-zero-interleave sequence of the code bits; and
- the summing comprises summing the bit values in every other bit position starting with the second bit position.

40. The method of claim 38, further comprising converting the code bits and the parity bit into a non-return-to-zero sequence.

41. The method of claim 38, further comprising storing the code bits and the parity bit on a magnetic storage medium.

42. A method for selecting code words from a group of code words, each selected code word representing a respective set of data bits and having a number of code bits that is greater than the number of data bits in the respective set of data bits, the method comprising:
- selecting from the group of code words a first subgroup of code words that each have a desired bit transition; and
- selecting from the first subgroup of code words a second subgroup of code words that have the fewest bit transitions.

43. The method of claim 38 wherein the selecting the first subgroup comprises selecting a first subgroup of code words that each have respective bit transitions within the first three bits and within the last three bits.

44. The method of claim 38, further comprising selecting from the second subgroup of code words a third subgroup of code words being the least probable to cause a multi-byte read error.

45. A method, comprising:
- generating a first portion of a code word from a set of data bits; and
- generating a second portion of the code word from a set of code bits, the second portion being sequential with the first portion and the code word including no data or code bits other than the data and code bits in the first and second portions, respectively, the first group including a single continuous sequence of all the data bits that compose the code word; and
- a single continuous sequence of code bits that represents a second group of data bits, the single continuous sequence of code bits including all of the code bits that compose the code word.

46. A method, comprising:
- setting a first portion of a code word equal to a set of data bits; and
- generating a second portion of the code word from a set of code bits.

47. A method, comprising:
- generating a first portion of a code word from a set of data bits;
- generating a second portion of the code word from a set of code bits; and
- wherein generating the second portion of the code word comprises decoding the code bits.

48. A method, comprising:
- generating a first portion of a code word from a set of data bits;
- generating a second portion of the code word from a set of code bits; and
- wherein the number of code bits in the set of code bits exceeds the number of data bits in the set of data bits.

49. A method, comprising:
- generating a first portion of a code word from a non-return-to-zero-interleave sequence of data bits; and
- generating a second portion of the code word from a non-return-to-zero-interleave sequence of code bits.

50. A method, comprising:
- generating a first portion of a code word, the first portion having eight data bits, from a set of eight data bits; and
- generating a second portion of the code word from a set of code bits.

51. A method, comprising:
- generating a first portion of a code word equal to a set of eight data bits; and
- generating a second portion of the code word from a set of code bits.

52. A method, comprising:
- generating a first portion of a code word from a set of data bits;
- generating a second portion of the code word from a set of seventeen code bits, the second portion having sixteen code bits.

53. A method, comprising:
- generating a first portion of a code word from a set of data bits;
- generating a second portion of the code word from a set of code bits; and
- checking the parity of the code word.

54. A method, comprising:
- generating a first portion of a code word from a set of data bits
- generating a second portion of the code word from a set of code bits;
- receiving a parity bit; and
- using the parity bit to check the parity of the code word.

* * * * *